United States Patent
Hanafi et al.

(10) Patent No.: US 6,916,694 B2
(45) Date of Patent: Jul. 12, 2005

(54) STRAINED SILICON-CHANNEL MOSFET USING A DAMASCENE GATE PROCESS

(75) Inventors: Hussein I. Hanafi, Basking Ridge, NJ (US); David J. Frank, Yorktown Heights, NY (US); Kevin K. Chan, Staten Island, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 10/650,400

(22) Filed: Aug. 28, 2003

(65) Prior Publication Data

US 2005/0045972 A1 Mar. 3, 2005

(51) Int. Cl.$^7$ ............................................... H01L 21/84
(52) U.S. Cl. ....................... 438/166; 438/530; 438/938
(58) Field of Search ............................... 438/166, 288, 438/530, 532, 938

(56) References Cited

U.S. PATENT DOCUMENTS 4,514,895 A * 5/1985 Nishimura .................. 438/166
6,310,367 B1 * 10/2001 Yagishita et al. ............ 257/190
6,593,191 B2 * 7/2003 Fitzgerald .................... 438/282

* cited by examiner

Primary Examiner—Chandra Chaudhari
(74) Attorney, Agent, or Firm—Scully, Scott, Murphy & Presser; Wan Yee Cheung, Esq.

(57) ABSTRACT

The present invention provides a method using a damascene-gate process to improve the transport properties of FETs through strain Si. Changes in mobility and FET characteristics are deliberately made in a Si or silicon-on-insulator (SOI) structure through the introduction of local strain in the channel region, without introducing strain in the device source and drain regions. The method has the advantage of not straining the source and drain regions resulting in very low leakage junctions and also it does not require any special substrate preparation like the case of a strained Si/relaxed SiGe system. Moreover, the method is compatible with existing mainstream CMOS processing. The present invention also provides a CMOS device that has a localized strained Si channel that is formed using the method of the present invention.

11 Claims, 6 Drawing Sheets

STRAINED SILICON-CHANNEL MOSFET USING A DAMASCENE GATE PROCESS

FIELD OF THE INVENTION

The present invention relates to semiconductor device manufacturing, and more particularly to a method of fabricating a metal oxide semiconductor field effect transistor (MOSFET) device having a Si channel region that is strained and adjoining source/drain junctions that are unstrained. The method of the present invention provides MOSFET devices having a very high channel carrier mobility, while maintaining a very low leakage junction.

BACKGROUND OF THE INVENTION

Improvements in transport properties, i.e., carrier mobility, through strain have been demonstrated in the operating characteristics of field effect transistors (FETs). For complementary metal oxide semiconductor (CMOS) devices, an improvement in device characteristics through enhanced carrier mobility has significant potential for the fabrication of very high-speed devices. Strained silicon on a relaxed SiGe substrate is one system where such an improvement occurs, see, for example, D. K. Nayak, et al., "High Mobility p-Channel Metal-Oxide-Semiconductor Field-Effect-Transistor on Strained Si," Appl. Phys. Lett., 62 (22), p.2853–2855 (1993).

Experimental research on enhanced carrier mobility MOSFETs caused by strain has concentrated on a strained Si layer grown on a relaxed SiGe substrate. MOSFET's fabricated using the Si/SiGe system exhibit the following disadvantages: (1) High source and drain junction leakage—the FET source and drain junctions, as well as the channel region, are formed in a strained Si area resulting in high junction leakage. (2) The Si/SiGe system MOSFET process is not compatible with mainstream CMOS fabrication techniques requiring specially prepared substrates using molecular beam epitaxy. (3) The Si/SiGe system MOSFET process is costly with low production rate.

In view of the drawbacks mentioned above, there is a need for providing a method of forming a MOSFET device in which the device channel is locally strained while the adjoining source/drain junctions are unstrained.

SUMMARY OF THE INVENTION

The present invention provides a novel method using a damascene-gate process to improve the transport properties of FETs through strained Si. In the inventive method, changes in mobility and FET characteristics are deliberately made in a bulk Si or silicon-on-insulator (SOI) structure through the introduction of local strain in the channel region, without introducing strain in the device source and drain junctions. The present method has the advantage of not straining the source and drain junctions resulting in very low leakage junctions and also it does not require any special substrate preparation like the case of the strained Si/relaxed SiGe system. Moreover, the method of the present invention is compatible with existing mainstream CMOS processing.

Moreover, the method of the present invention is capable of forming a localized strained Si channel while not requiring that the gate implantation be very shallow. Thus, the inventive method does not have to avoid long anneal cycles. Additionally, in the present method the source/drain implants are not carried out during the gate implantation therefore shallow source/drain junctions having a depth of about 20 nm or less are possible.

The above-mentioned objects and advantages are achieved in the present invention by forming the gate in a damascene-gate process in a gate opening by depositing amorphous silicon, i.e., a:Si, at a temperature of less than about 600° C., preferably at a temperature between 500° and 600° C. During a subsequent anneal, the a:Si is converted into a polySi gate while introducing the desired localized strain in an underlying Si region without impacting the adjoining source and drain area. Source/drain junction formation occurs after formation of the strained Si channel therefore the junctions can be very shallow.

Specifically, the method of the present invention comprises the steps of:

providing a structure comprising a dummy gate that has an upper surface that is coplanar with an upper surface of an oxide layer, said dummy gate is located on a sacrificial oxide that is positioned atop a Si-containing substrate;

removing the dummy gate to provide a gate opening that exposes a portion of the sacrificial oxide, said gate opening defining a device channel in said Si-containing substrate;

removing the exposed portion of the sacrificial oxide in the gate opening;

forming a gate dielectric and amorphous Si gate in said gate opening;

implanting dopants in said amorphous Si gate and annealing the dopants in said amorphous Si gate to convert said amorphous Si gate into a polySi gate, while introducing localized strain into said device channel; and removing the oxide layer and forming source/drain junctions in portions of the Si-containing substrate that adjoin the localized strained device channel.

The method above is a damascene method since the gate is formed in a gate opening. The inventive method is compatible with existing mainstream CMOS processes resulting in low cost and high production rate. The method of the present invention allows for n- or p-type devices to be formed atop the localized strain channel. This is unlike the process disclosed in K. Ota, et al., "Novel Locally Strained Channel Technique for High Performance 55 nm CMOS", December 2002, IEDM conference where PMOS devices cannot be strained due to the lack of "heavy" implant acceptor ions to cause amorphization of the p-type gates.

The damascene method described above provides a CMOS device that comprises a Si-containing substrate having a localized strained device channel and adjoining source/drain junctions;

a gate dielectric located on said localized strained device channel; and a polySi gate located on said gate dielectric.

The source/drain junctions may be very shallow since they are formed after polySi gate formation and annealing.

DETAILED DESCRIPTION OF THE INVENTION

The present invention, which provides a method of fabricating local strained channel MOSFETs, will now be described in greater detail by referring to the drawings that accompany the present application. In the accompanying drawings, like and/or corresponding elements are referred to by like reference numerals.

Figure 1:
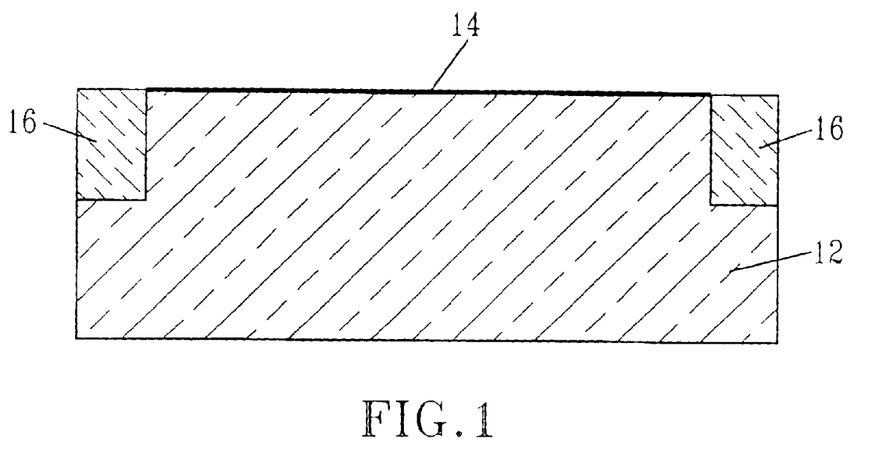
FIG. 1 is a pictorial representation (through a cross sectional view) illustrating an initial structure that can be used in the present invention.

Reference is first made to FIG. 1 that illustrates an initial structure 10 that can be employed in the present invention. Specifically, the initial structure 10 shown in FIG. 1 comprises a Si-containing semiconductor substrate or wafer 12 having trench isolation regions 16 formed therein and a pad oxide layer 14 located on surface portions of the Si-containing semiconductor substrate 12.

The term "Si-containing semiconductor substrate" denotes any semiconductor material that includes at least silicon. Illustrative examples of Si-containing semiconductor materials that can be used as substrate 12 include, but are not limited to: Si, SiGe, SiC, SiGeC, silicon-on-insulators (SOIs), or SiGe-on-insulators (SGOI). The substrate 12 may be undoped or doped depending upon the device to be fabricated thereon. In one preferred embodiment of the present invention, Si-containing semiconductor substrate 12 is a p-type Si substrate.

When SOI or SGOI substrates are employed, region 12 denotes the top Si-containing layer of the substrate that is isolated from a bottom Si-containing substrate (not shown) by a buried oxide layer (not shown).

After providing the substrate 12, the pad oxide layer 14 is formed on an upper exposed surface of the substrate 12 by using a conventional thermal oxidation process. Alternatively, the pad oxide layer 14 may be formed by a deposition process, such as chemical vapor deposition (CVD), plasma-assisted CVD, evaporation, or chemical solution deposition. Pad oxide layer 14 formed at this point of the inventive process is a thin oxide layer that typically has a thickness of from about 6 to about 15 nm.

Next, trench isolation regions 16 are formed into the substrate 12 by first forming a hardmask (not shown) on the surface of the pad oxide layer 14 and then utilizing lithography and etching. The lithographic step employed in the present invention includes applying a photoresist (not shown) to the hardmask that overlies the pad oxide layer 14; exposing the photoresist to a pattern of radiation (in the present case a trench pattern is formed); and developing the pattern into the photoresist by utilizing a conventional resist developer. The etching step, which is used to transfer the trench pattern first into the hardmask and then into the pad oxide layer 14 and the substrate 12, includes any conventional dry etching process such as reactive-ion etching, ion beam etching, plasma etching, laser ablation or any combination thereof. A single etching process may be employed, or alternatively, more than one etching process may be employed to form trenches in the substrate 12. After the pattern has been transferred into the hardmask, the photoresist is typically removed from the structure and then pattern transfer continues using the hardmask as an etch mask.

After trenches have been formed in the substrate 12, the trenches are filled with a trench dielectric material such as high-density plasma (HDP) oxide or TEOS (tetraethylorthosilicate) using conventional deposition processes well known to those skilled in the art. The filled trenches form the trench isolation regions 16 shown in FIG. 1. In some embodiments of the present invention, the walls of the trenches are lined with a liner material, such as $SiO_2$ or $Si_3N_4$, prior to filling with the trench fill material. After the filling process, a conventional planarization process and/or densification may be performed on the structure. The planarization process stops on the hardmask and thereafter the hadmask is typically removed by utilizing an etching process that selectively removes the hardmask material from the structure.

Figure 2:
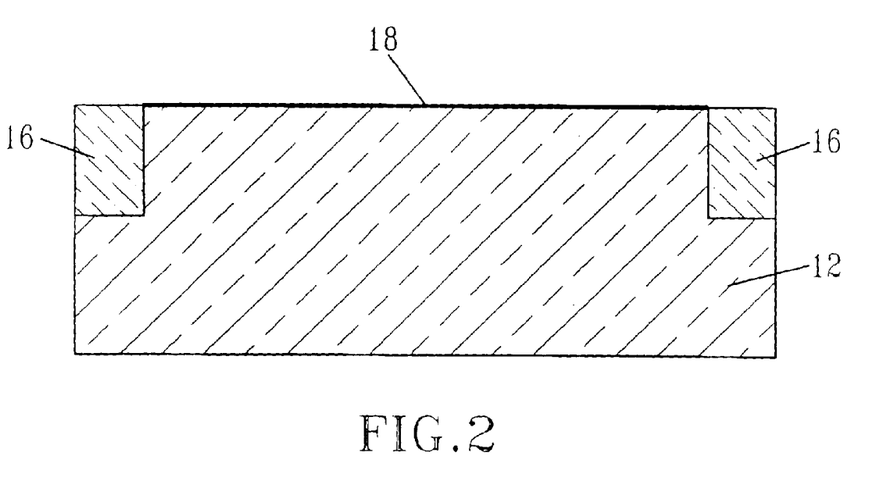
FIG. 2 is a pictorial representation (through a cross sectional view) illustrating the structure that is formed after removing the pad oxide from the initial structure shown in FIG. 1 and forming a sacrificial oxide on exposed Si surface.

Next, and as illustrated in FIG. 2, the pad oxide layer 14 is removed from the surface of substrate 12 using a stripping process that is highly selective in removing oxide and thereafter sacrificial oxide layer 18 is formed on the substrate 12 utilizing a conventional thermal oxidation process. Sacrificial oxide layer 18 formed at this point of the inventive process typically has a thickness of from about 3 to about 20 nm, with a thickness of from about 3 to about 6 nm being highly preferred. Note that the sacrificial oxide layer 18 is grown substantially over the substrate 12, not atop trench isolation region 16.

Figure 3:
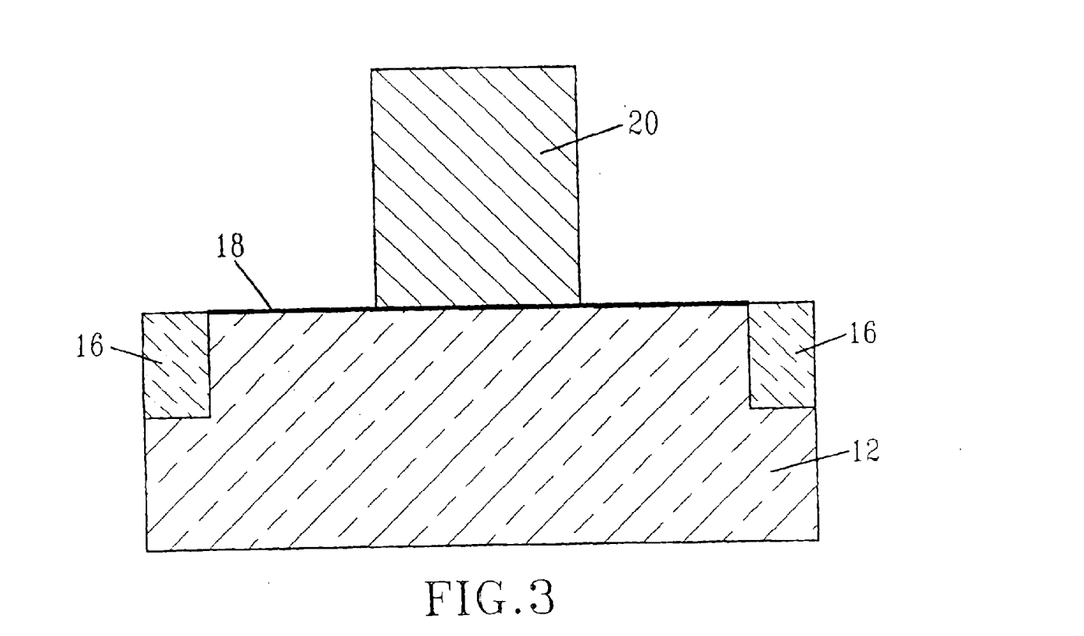
FIG. 3 is a pictorial representation (through a cross sectional view) illustrating the structure that is formed after a dummy gate has been formed on a portion of the structure shown in FIG. 2.

A dummy gate 20 comprising a sacrificial polysilicon region or other related material is then formed on a portion of the sacrificial oxide layer 18 providing the structure shown, for example, in FIG. 3. The dummy gate 20 is formed by first providing a sacrificial polysilicon layer or other related material atop the sacrificial oxide layer 18 utilizing a conventional deposition process such as CVD or PECVD. The sacrificial polysilicon layer or other related material is then patterned by lithography and etching.

Figure 4:
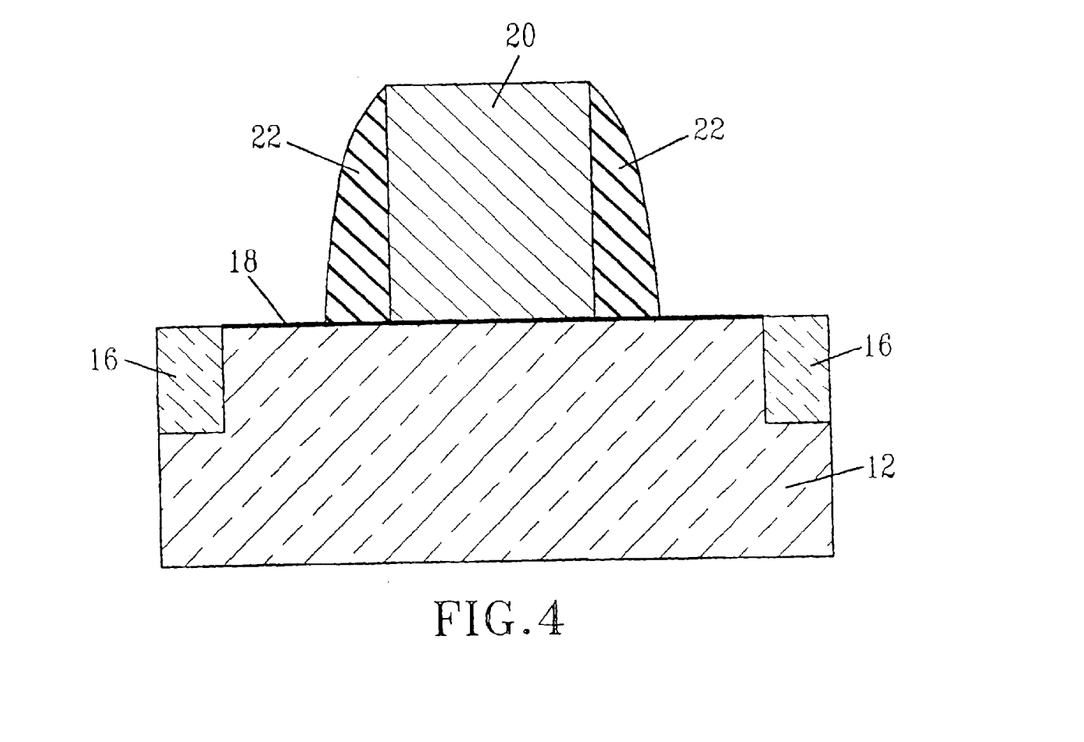
FIG. 4 is a pictorial representation (through a cross sectional view) illustrating the structure after formation of an insulating spacer on each sidewall of the dummy gate shown in FIG. 3.

FIG. 4 shows the structure after an insulating spacer 22 is formed on each sidewall of the dummy gate 20. Insulating spacers 22, which comprise a nitride, oxynitride or a combination thereof, are formed by deposition and etching. Insulating spacers 22 may have a variable thickness, but typically insulating spacers 22, as measured from a bottom surface, have a thickness of from about 10 to about 30 nm.

It should be noted that the present invention is not limited to forming just a single dummy gate 20 on the surface of the sacrificial oxide layer 18. Instead, the present invention works equally well when a plurality of dummy gates 20 are formed. The formation of a plurality of dummy gates 20 will allow for the formation of a plurality of MOSFETs across the surface of the substrate 12.

Figure 5:
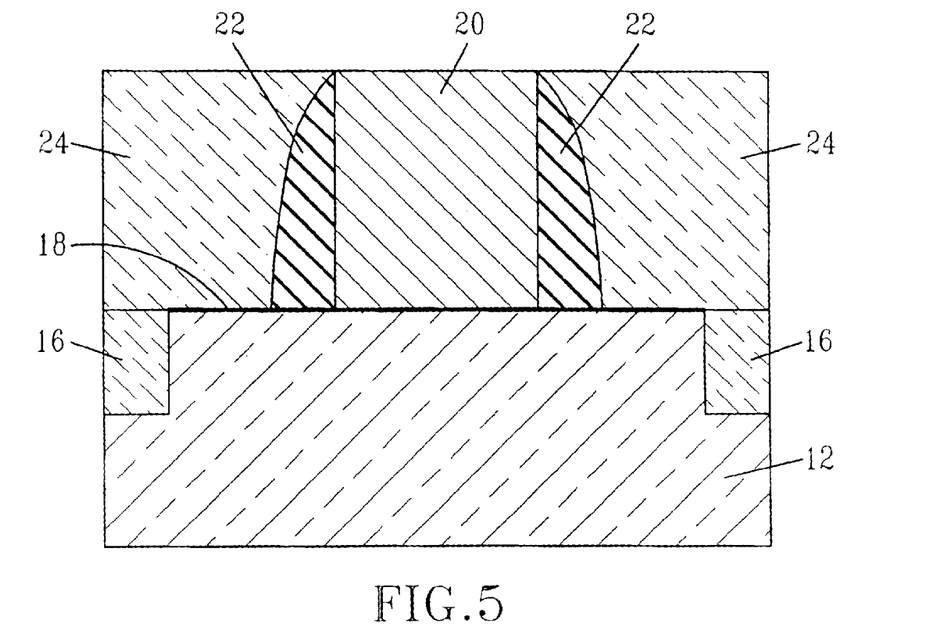
FIG. 5 is a pictorial representation (through a cross sectional view) illustrating the structure that is formed after oxide deposition and planarization.

After forming the structure shown in FIG. 4, an oxide layer 24 such as high-density plasma (HDP) oxide or TEOS is deposited and planarized such that an upper surface of the oxide layer 24 is coplanar with an upper surface of dummy gate 20. The resultant structure including the planarized oxide layer 24 is shown, for example, in FIG. 5.

Figure 6:
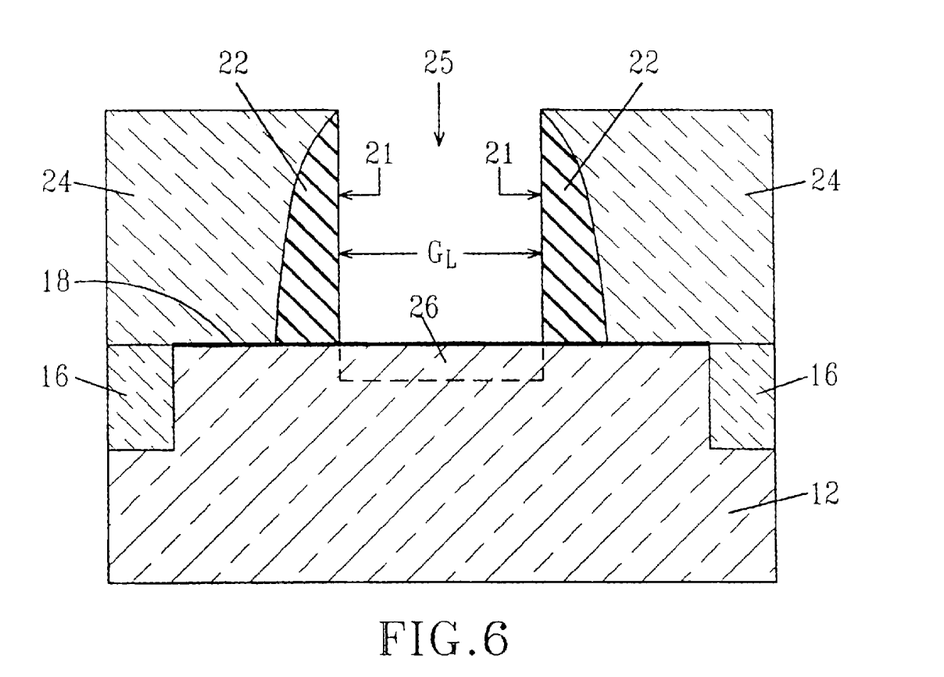
FIG. 6 is a pictorial representation (through a cross sectional view) illustrating the structure having a gate opening after the dummy gate has been removed from the planar structure shown in FIG. 5.

Next, the dummy gate 20, i.e., sacrificial polysilicon region or other related material, is removed from the structure using chemical downstream etching or KOH stopping atop the sacrificial oxide layer 18. The resultant structure, which includes a gate opening 25 that is formed after this step has been performed, is shown, for example, in FIG. 6. Note that the inner edges 21 of insulating spacers 22, which define the boundaries of the gate opening 25, define the length $G_L$ of device channel 26.

Figure 7:
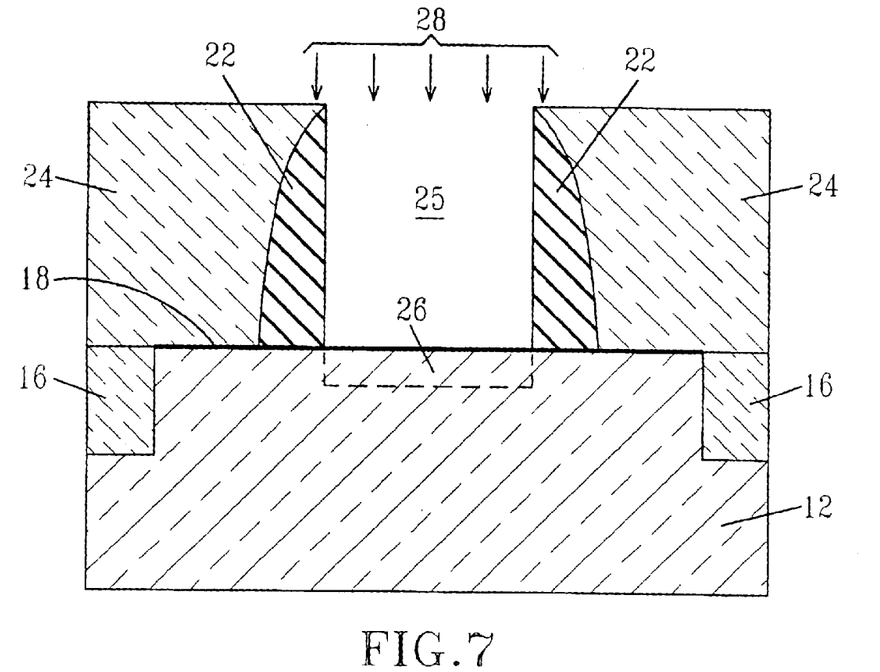
FIG. 7 is a pictorial representation (through a cross sectional view) illustrating the structure that is formed after device channel implantation and annealing.

At this point of the inventive method, device channel (i.e., body region) 26 is subjected to an ion implantation step and an annealing step. The conditions used in the ion implantation step and the annealing step are well known to those skilled in the art. The annealing step serves to activate the dopants within the device channel 26. For example, the device channel 26 may be ion implanted with a p-type dopant using any ion dosage such 1E12 to about 5E13 atoms/cm$^3$ and annealed at any conditions such as, for example, 1000° C., for 5 seconds in Ar. An n-type dopant is also contemplated herein. The structure showing ion implantation into the device channel 26 is shown, for example, in FIG. 7. In FIG. 7, reference numeral 28 denotes ions being implanted into the device channel 26.

The exposed sacrificial oxide 18 in the gate opening 25 is then removed from the structure to expose the device channel 26. Specifically, the exposed sacrificial oxide 18 in the gate opening is removed by utilizing a chemical oxide removal (COR) process. The COR process employed in the present invention is carried out at relatively low pressures (6 millitorr or less) in a vapor, or more preferably, a plasma of HF and NH$_3$. The HF and NH$_3$ mixture is used as an etchant that selectively removes oxide from the structure. The resultant structure that is formed after the COR step has been performed is shown, for example, in FIG. 8.

Figure 8:
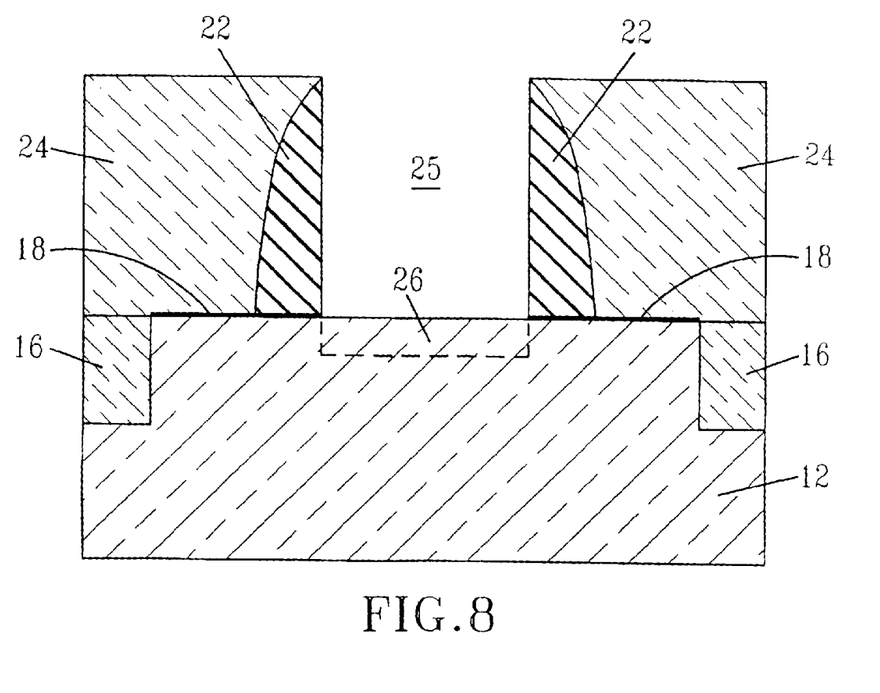
FIG. 8 is a pictorial representation (through a cross sectional view) illustrating the structure that is formed after the exposed portion of sacrificial oxide in the gate opening has been selectively removed.

Next, gate dielectric 30 is formed atop the exposed device channel 26 utilizing a conventional deposition process. Alternatively, the gate dielectric 30 may be formed by a thermal oxidation, nitridation or oxynitridation process. Combinations of the aforementioned processes may also be used in forming the gate dielectric 30. The gate dielectric 30 may be composed of any conventional dielectric including, but not limited to: SiO$_2$; Si$_3$N$_4$; SiON; SiON$_2$; high-k dielectrics such as TiO$_2$, Al$_2$O$_3$, ZrO$_2$, HfO$_2$, Ta$_2$O$_5$, La$_2$O$_3$; and other like oxides including perovskite-type oxides. Typically, the high-k dielectrics are capable of withstanding high-temperature (900° C.) anneals. Gate dielectric 30 may also comprise any combination of the aforementioned dielectric materials.

Gate dielectric 30 is typically thinner than the sacrificial oxide layer 18. Generally, when the gate dielectric 30 is composed of SiO$_2$, Si$_3$N$_4$, SiON or SiON$_2$, it has a thickness of about 1 to about 5 nm. For the other gate dielectrics, the thickness would provide a equivalent oxide thickness in the range mentioned above.

After the gate dielectric 30 has been formed, amorphous Si is deposited using a deposition process such as low pressure chemical vapor deposition (LPCVD) that is performed at a temperature of less than about 600° C., preferably between 500° C.–600° C., and then the deposited amorphous Si is planarized providing an amorphous Si region in the gate opening 25. Following the formation of amorphous Si region, a gate implantation and anneal step is performed. The dopant used during the implantation may be either a p-type dopant or an n-type dopant depending on the type of device to be fabricated.

The annealing conditions used at this point of the present invention cause recrystallization of the amorphous Si region into a polySi gate 32, while causing activation and diffusion of the dopant to the interface between the polySi gate and the gate dielectric 30. Moreover, the annealing step performed at this point of the present invention creates tensile strain in the device channel 26. That is, a localized strained channel 34 is formed during the annealing step. This process allows one to build either n- or p-devices having a localized strained channel, which are both under a tensile strength. The activation and diffusion of dopant in amorphous Si requires much longer diffusion time than polySi due to the absence of grain boundaries in crystallized amorphous Si which speeds up dopant diffusion. The annealing step is performed at a temperature of about 1000° C. or greater for a time period of greater than 5 seconds, preferably about 30 min. The annealing is carried out preferably in nitrogen or any other inert gas.

Figure 9:
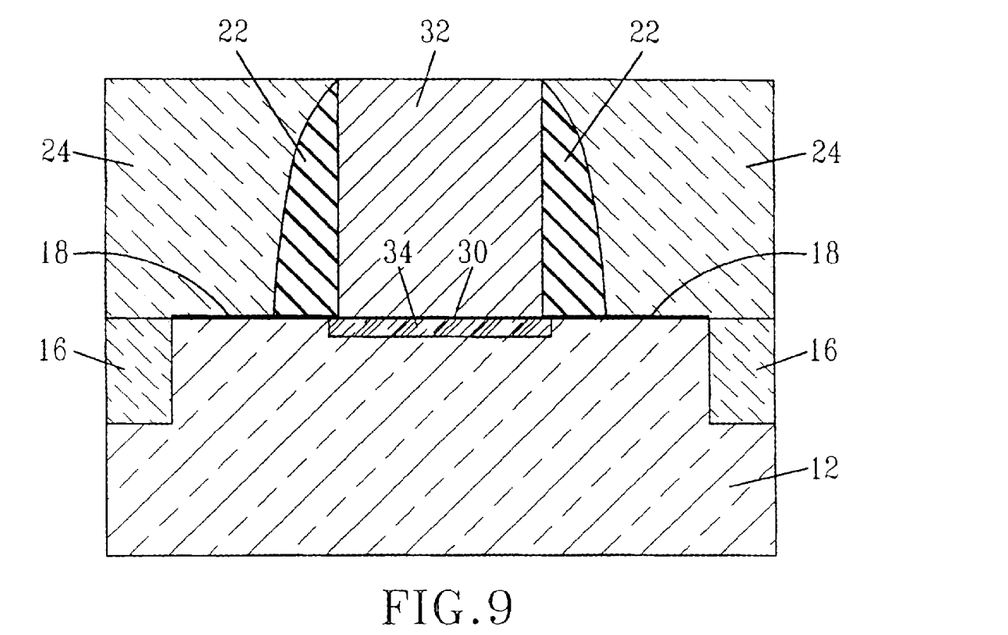
FIG. 9 is a pictorial representation (through a cross sectional view) illustrating the structure that is formed after formation of the gate dielectric, deposition of a:Si on the gate dielectric, implantation and annealing.

The structure including gate dielectric 30, polygate 32 and localized strained channel 34 is shown, for example, in FIG. 9. In this structure the Si substrate adjoining the localized strained channel 34 has not be affected; therefore it is in a non-strained state.

Figure 10:
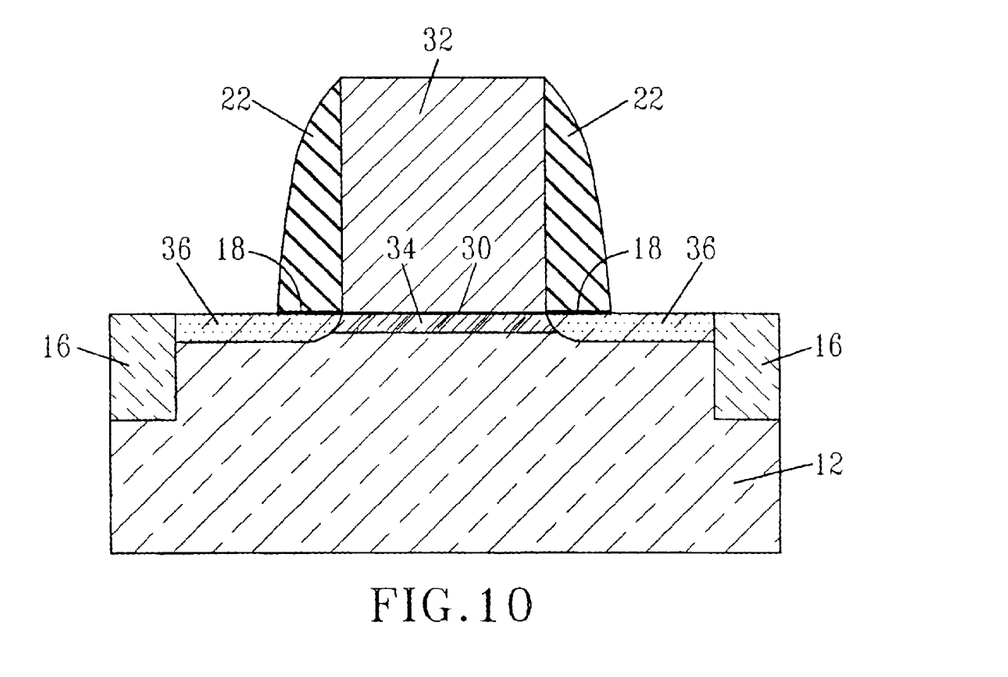
FIG. 10 is a pictorial representation (through a cross sectional view) illustrating the structure after oxide removal and source and drain formation.

Reference is now made to the structure shown in FIG. 10 which is formed after the following processing steps have been carried out: First, the oxide layer 24 is removed from the structure using an etching process that is highly selective in removing oxide. Note that the sacrificial oxide layer 18 underlying the oxide layer 24 is also typically removed from the structure during this etch. Source/drain junctions (or regions) 36 are then formed into substrate 12 using a conventional angle implantation process followed by an annealing step. The implant is activated by annealing using conditions well known to those skilled in the art. For example, the implant may be annealed at 1000° C. for 1 second or longer.

At this point of the present invention, raised source/drain regions (not shown) may be optionally formed atop the surface of the source/drain regions by epitaxially growing an epi Si layer thereon. To either the raised source/drain regions or to the previously formed source/drain regions 36, salicide regions 38 may be formed using a conventional salicidation process that includes, for example, forming a refractory metal such as Ti, Co or Ni on Si surfaces; heating the structure to form silicide regions and thereafter removing any non-reactive metal that was not converted into a silicide during the heating process. The resultant structure including salicide regions 38 (self-aligned silicide) is shown, for example, in FIG. 11. Since the gate is comprised of polySi, a salicide region 38' is also formed thereon, unless appropriate steps (such as block mask formation) are taken to prevent the formation of a salicide region in the polysilicon gate conductor.

Figure 11:
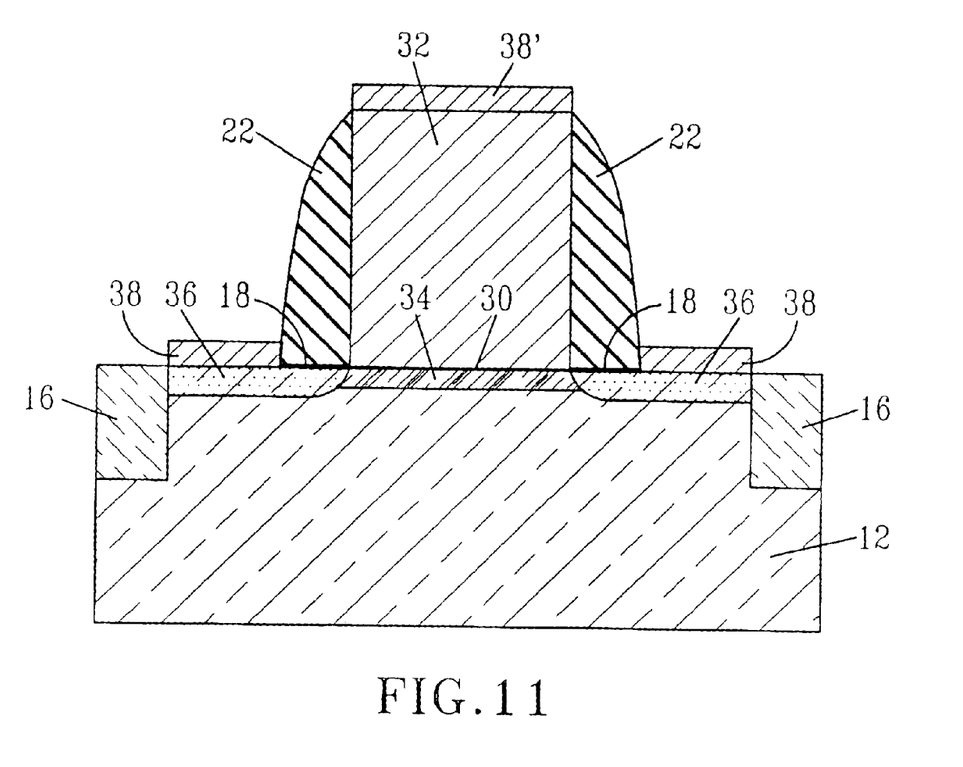
FIG. 11 is a pictorial representation (through a cross sectional view) illustrating the structure that is formed after silicide formation.

Further BEOL (back-end-of-the-line) processes may be formed on the structure shown in FIG. 11. For example, a layer of insulating material such as BPSG (boron doped phosphorus silicate glass) can be formed over the structure by deposition and planarization. Contact openings can be formed into the insulating layer by lithography and etching and thereafter the contact holes can be filled with a conductive material, such as, for example, Cu, Al, W, polysilicon and other like conductive materials.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

Having thus described our invention in detail, what we claim as new and desire to secure by the Letters Patent is:

1. A method of forming a MOSFET device comprising the steps of:

providing a structure comprising a dummy gate that has an upper surface that is coplanar with an upper surface of an oxide layer, said dummy gate is located on a sacrificial oxide that is positioned atop a Si-containing substrate;

removing the dummy gate to provide a gate opening that exposes a portion of the sacrificial oxide, said gate opening defining a device channel in said Si-containing substrate;

removing the exposed portion of the sacrificial oxide in the gate opening;

forming a gate dielectric and amorphous Si gate in said gate opening;

implanting dopants in said amorphous Si gate and annealing the dopants in said amorphous Si gate to convert said amorphous Si gate into a polySi gate, while introducing localized strain to said device channel; and removing the oxide layer and forming source/drain junctions in portions of the Si-containing substrate that adjoin the localized strained device channel.

2. The method of claim 1 wherein said dummy gate has sidewalls that have an insulator spacer located thereon, said insulator spacer is positioned between said dummy gate and the oxide layer.

3. The method of claim 1 wherein said removing of the dummy gate comprises chemical downstream etching or etching in KOH.

4. The method of claim 1 wherein said removing the exposed portion of the sacrificial oxide comprises a chemical oxide removal (COR) step.

5. The method of claim 4 wherein the COR step is carried out at a pressures of about 6 millitorr or less in a vapor or a plasma of HF and $NH_3$.

6. The method of claim 1 wherein the device channel is doped by ion implantation and annealing prior to removing the exposed portion of the sacrificial oxide layer.

7. The method of claim 1 wherein said forming said amorphous Si gate comprises deposition at a temperature of about 600° C. or less and planarization.

8. The method of claim 1 wherein the annealing is performed at a temperature of about 1000° C. for a time period of greater than 5 seconds and in the presence of nitrogen.

9. The method of claim 1 wherein the removing of the oxide layer comprises an etching process that is highly selective in removing oxide.

10. The method of claim 1 wherein the source/drain junctions are formed by an angle implantation process and annealing.

11. The method of claim 1 further comprising forming salicide regions on the source/drain junctions.

* * * * *